US010359699B2

(12) United States Patent
Yang et al.

(10) Patent No.: US 10,359,699 B2
(45) Date of Patent: Jul. 23, 2019

(54) SELF-ADAPTIVE HALOGEN TREATMENT TO IMPROVE PHOTORESIST PATTERN AND MAGNETORESISTIVE RANDOM ACCESS MEMORY (MRAM) DEVICE UNIFORMITY

(71) Applicant: Taiwan Semiconductor Manufacturing Company, Ltd., Hsinchu (TW)

(72) Inventors: Yi Yang, Fremont, CA (US); Dongna Shen, San Jose, CA (US); Jesmin Haq, Milpitas, CA (US); Yu-Jen Wang, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 38 days.

(21) Appl. No.: 15/685,240

(22) Filed: Aug. 24, 2017

(65) Prior Publication Data
US 2019/0064661 A1    Feb. 28, 2019

(51) Int. Cl.
*G03F 7/004* (2006.01)
*H01J 37/32* (2006.01)

(52) U.S. Cl.
CPC ...... *G03F 7/0048* (2013.01); *H01J 37/32082* (2013.01)

(58) Field of Classification Search
None
See application file for complete search history.

(56) References Cited

U.S. PATENT DOCUMENTS

| | | | |
|---|---|---|---|
| 6,806,096 B1 | 10/2004 | Kim et al. | |
| 6,984,529 B2 | 1/2006 | Stojakavic et al. | |
| 7,001,783 B2 | 2/2006 | Costrini et al. | |
| 7,060,194 B2 | 6/2006 | Kodaira et al. | |
| 7,696,551 B2 | 4/2010 | Xiao et al. | |
| 8,202,441 B2 | 6/2012 | Chandrachood et al. | |
| 8,722,543 B2 | 5/2014 | Belen et al. | |
| 9,166,154 B2 | 10/2015 | Satoh et al. | |
| 9,269,894 B2 | 2/2016 | Mudivarthl et al. | |
| 9,275,713 B2 | 3/2016 | Guo | |
| 9,362,490 B1 | 6/2016 | Xiao | |
| 2003/0073251 A1 | 4/2003 | Ning | |
| 2003/0224606 A1* | 12/2003 | Laaksonen | H01L 21/0337 438/694 |

(Continued)

*Primary Examiner* — Allan W. Olsen
(74) *Attorney, Agent, or Firm* — Haynes and Boone, LLP

(57) ABSTRACT

A process flow for shrinking a critical dimension (CD) in photoresist features and reducing CD non-uniformity across a wafer is disclosed. A photoresist pattern is treated with halogen plasma to form a passivation layer with thickness (t1) on feature sidewalls, and thickness (t2) on the photoresist top surface where t2>t1. Thereafter, an etch based on $O_2$, or $O_2$ with a fluorocarbon or halogen removes the passivation layer and shrinks the CD. The passivation layer slows the etch such that photoresist thickness is maintained while CD shrinks to a greater extent for features having a width (d1) than on features having width (d2) where d1>d2. Accordingly, CD non-uniformity is reduced from 2.3% to 1% when d2 is 70 nm and is shrunk to 44 nm after the aforementioned etch. After a second etch through a MTJ stack to form MTJ cells, CD non-uniformity is maintained at 1%.

21 Claims, 3 Drawing Sheets

(56) References Cited

U.S. PATENT DOCUMENTS

| | | |
|---|---|---|
| 2005/0277207 A1 | 12/2005 | Costrini et al. |
| 2007/0215911 A1 | 9/2007 | Torng et al. |
| 2009/0078927 A1 | 3/2009 | Xiao et al. |
| 2009/0159563 A1 | 6/2009 | Jung |
| 2009/0261437 A1 | 10/2009 | Kang et al. |
| 2009/0311635 A1* | 12/2009 | Chen .................. G03F 7/091 |
| | | 430/323 |

* cited by examiner

SELF-ADAPTIVE HALOGEN TREATMENT TO IMPROVE PHOTORESIST PATTERN AND MAGNETORESISTIVE RANDOM ACCESS MEMORY (MRAM) DEVICE UNIFORMITY

RELATED PATENT APPLICATION

This application is related to Ser. No. 15/595,484, filing date May 15, 2017; which is assigned to a common assignee and is herein incorporated by reference in its entirety.

TECHNICAL FIELD

The present disclosure relates to a method of shrinking a critical dimension (CD) in a plurality of photoresist features in a controllable manner by using a halogen treatment to form a thicker passivation layer on the top surface of each photoresist feature than on the sidewalls thereof, and then performing an oxygen, fluorocarbon and/or halogen based etch to remove the passivation layer and exposed portions of the sidewalls without decreasing the thickness of the photoresist thereby improving CD uniformity across the wafer.

BACKGROUND

A MTJ memory element is also referred to as a MTJ nanopillar or MTJ cell and is a key component in magnetic recording devices, and in memory devices such as magnetoresistive random access memory (MRAM) and spin torque transfer (STT)-MRAM. An important step in fabricating an array of MTJ cells (MTJs) is patterning a photoresist layer on an uppermost hard mask in a MTJ stack of layers. The pattern is produced with a photolithography process, and is etch transferred into the hard mask which then serves as an etch mask during a second etch that transfers the pattern through the MTJ stack to form an array of MTJs each with a critical dimension (CD) that in state of the art devices is substantially less than 100 nm from a top-down view. The first etch may be a reactive ion etch (RIE) while the second etch involves either RIE or an ion beam etch (IBE).

A MTJ stack of layers includes two ferromagnetic layers called the free layer (FL) and reference layer (RL), and a dielectric layer (tunnel barrier) between the FL and RL. The RL has a fixed magnetization preferably in a perpendicular-to-plane direction (perpendicular magnetic anisotropy or PMA) while the FL is free to rotate to a direction that is parallel or anti-parallel to the RL magnetization direction thereby establishing a "0" or "1" memory state for the MTJ. The magnetoresistive ratio is expressed by dR/R where dR is the difference in resistance between the two magnetic states when a current is passed through the MTJ, and R is the minimum resistance value.

Precise patterning is required to generate uniform island features in the photoresist layer that are subsequently processed to form non-interacting MTJ devices each having a CD that is within a tight tolerance in order to ensure substantially uniform magnetic properties from one MTJ device to the next. Furthermore, etch transfer processing through the MTJ stack of layers is challenging since there are a variety of materials (magnetic alloys, non-magnetic metals, and dielectric films) that each have a different etch rate when subjected to IBE with Ar, or to fluorocarbon or oxygen based RIE. Thus, the hard mask must have sufficient thickness and etch resistance to remain intact during the MTJ etch.

As CDs decrease significantly below 100 nm in advanced memory products, processing becomes increasingly more expensive in order to meet performance requirements in terms of minimum CD, and CD uniformity across the wafer. For example, the exposure wavelength of incident light in the photolithography process used to pattern the photoresist layer may be reduced from 248 nm (KrF source) to 193 nm (ArF source) to print features with smaller CDs, and higher yields. However, ArF exposure tools are significantly more expensive than KrF exposure tools. Moreover, process latitude that includes depth of focus, and exposure latitude also becomes more difficult to control as the CD target for the photolithography step approaches 60 nm or lower. Optical proximity correction (OPC) of chrome patterns on quartz masks that are used during photolithography exposures is often relied upon to assist in generating the desired photoresist feature shapes and sizes but adds design complexity and cost. Thus, processing steps that can shrink the CD after the initial pattern is formed by photolithography, and that avoid relying on more expensive exposure tools and OPC in quartz masks to deliver a minimum CD less than 60 nm, are highly desirable in minimizing manufacturing cost.

Another important consideration is to maintain a sufficient thickness for the photoresist pattern while generating the minimum CD so that the photoresist mask survives a subsequent etch through the underlying hard mask. The photoresist cannot be too thick or the aspect ratio (thickness/width) of the resulting features will be too large and prevent small CDs from being printed. Accordingly, photoresist thickness is preferably maintained during any post photolithography process that decreases the CD before the etch transfer through the hard mask.

SUMMARY

One objective of the present disclosure is to provide a method for fabricating sub-60 nm photoresist features that is achievable with 248 nm or 193 nm photolithography processes.

A second objective of the present disclosure is to provide a method according to the first objective that also reduces CD non-uniformity across the wafer and maintains photoresist thickness.

According to a preferred embodiment, these objectives are achieved by coating a photoresist layer on an unpatterned MTJ stack of layers having at least a reference layer, free layer, a tunnel barrier between the free layer and reference layer, and an uppermost hard mask. In some embodiments, a seed layer is employed as the bottommost MTJ layer. Typically, a bottom anti-reflective coating (BARC) that may be a cross-linked polymer, or a dielectric anti-reflective coating (DARC) such as SiON is deposited on a top surface of the MTJ stack before the photoresist layer is coated to enable photoresist features with more uniform CDs to be formed in the subsequent photolithography process. In one embodiment, a photolithography process using a 248 nm exposure tool is employed to patternwise expose the photoresist layer. After a post-exposure bake and aqueous base development, a plurality of island features is formed on the BARC or DARC and above the hard mask layer. According to the exemplary embodiment, photoresist island features are formed in an array of rows and columns. A first island feature has a first width (d1) while an adjacent island feature has a second width (d2) where d1>d2. Generally, there is a certain non-uniformity in island features across the wafer where non-uniformity (sigma) is around 2.3% for an island width target of 70 nm.

The present disclosure also encompasses embodiments where a 193 nm exposure tool is employed to perform patternwise exposures. Furthermore, the photoresist pattern is not limited to island features and may be comprised of line/space patterns or other designs used in the art. The alternative patterns may be formed on film stacks that are subsequently processed to yield semiconductor devices as appreciated by those skilled in the art.

In the exemplary embodiment, island features printed in the photolithography pattern are device features that are subsequently processed to form active MTJ cells. A key aspect of the present disclosure is a halogen treatment process wherein the features in the photoresist pattern are subjected to halogen plasma in a process chamber such as an etch chamber. For example, the halogen treatment may comprise a HBr, HCl, HI, $Cl_2$, $Br_2$, or $F_2$ flow rate from 10 to 200 standard cubic centimeters per second (sccm), a radio frequency (RF) source power from 100 to 1000 Watts, a bias power from 0 to 100 Watts, a base pressure between 8 mTorr and 50 mTorr, and a reaction time of about 5 to 100 seconds. As a result, a halogen passivation layer is formed along the sidewalls and top surfaces of the features as well as on exposed portions of the BARC or DARC top surface between the features. In particular, the halogen treatment is controlled to an extent that the deposited passivation layer has a greater thickness on the top surfaces of the features and BARC or DARC than on the feature sidewalls. Furthermore, the passivation layer has a first thickness on the sidewalls of features of width d1 that is less than a second thickness on the sidewalls of features having width d2.

In the following step, a first RIE that is based on plasma generated from $O_2$, or $O_2$ mixed with a halogen such as $Cl_2$, or mixed with a fluorocarbon such as $CF_4$ is used to remove the passivation layer and shrink the features to a smaller CD. We have surprisingly discovered that the photoresist features maintain their thickness through the halogen treatment and first RIE step. It is believed that the presence of the passivation layer slows the etch rate removal of side portions of the photoresist features, and acts as a sacrificial layer to prevent etching of feature top surfaces. Moreover, feature width shrinks significantly from d1 to d3 and from d2 to d4 where the difference (d1–d3) is greater than (d2–d4) because of a thinner passivation layer on the sidewalls of features having width d1. Heating the substrate to around 80° C. before and during the first RIE is believed to reflow the photoresist features and thereby contribute to feature width shrinkage. Besides shrinking the CD of features to widths as small as 40 nm without relying on more expensive ArF (193 nm) exposure tools, there is an added benefit in substantially decreasing across wafer non-uniformity (sigma). However, if smaller feature sizes with CDs proximate to 30 nm or less are desired, then the photolithography process is preferably based on 193 nm exposures.

Thereafter, the photoresist pattern is etch transferred through the BARC or DARC, and through the hard mask by a second RIE step that may be a fluorocarbon or chlorocarbon etch. In some embodiments where oxygen and a fluorocarbon are selected for the first RIE, the second RIE may be a continuation of the first RIE in the same process chamber, and comprises substantially the same etch conditions as the first RIE.

A third RIE step or an IBE may then be performed to etch transfer the pattern of island features in the hard mask through the remaining MTJ layers. In one preferred embodiment, the third RIE or IBE comprises plasma or ions that are based not only on a chemical component such as an oxidant that is MeOH or the like, but also include a physical component comprised of noble gas ions where the noble gas is one of Ar, Kr, Xe, or Ne. As a result, noble gas ions or plasma substantially minimize chemical damage to the MTJ sidewalls, and redeposition of etched residue on the MTJ sidewalls is significantly reduced by the chemical component. Finally, an encapsulation layer is deposited on the resulting MTJ cells, and then a chemical mechanical polish (CMP) process or another planarization step is performed to remove all material above a plane that includes the hard mask top surface. The CMP process forms a hard mask top surface that is coplanar with the surrounding encapsulation layer. From a top-down view, the MTJ cells form an array of circular or elliptical shapes, for example.

DETAILED DESCRIPTION

Figure 1:
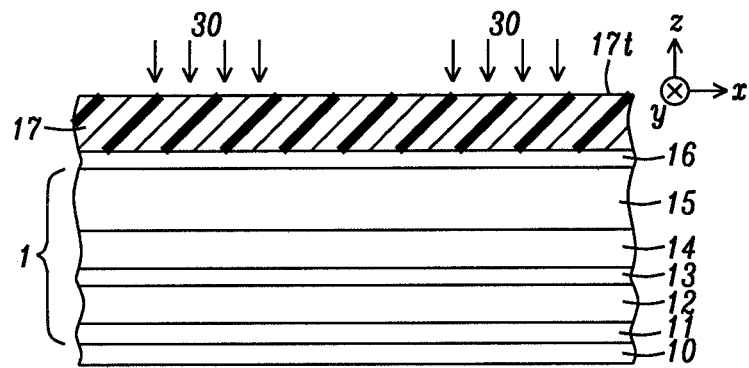
FIG. 1 is a cross-sectional view of a photolithography process step involving patternwise exposure of a photoresist layer on a MTJ stack of layers, and with a BARC or DARC between the photoresist layer and MTJ stack.

The present disclosure relates to a sequence of process steps that include shrinking a plurality of features in a photoresist pattern to a smaller width or critical dimension (CD), and etch transferring the photoresist pattern through a MTJ stack of layers, or through another stack of layers that are processed to yield a semiconductor device. In particular, halogen treatment of the photoresist features and subsequent removal of the resulting passivation layer shrinks feature size, maintains photoresist thickness, and decreases CD non-uniformity of photoresist features across the wafer. In the drawings, the z-axis direction is a thickness dimension, and the x-axis and y-axis directions are in the planes of the MTJ and photoresist layers. Although the exemplary embodiments disclose a halogen treatment and etch sequence that is designed for 248 nm photolithography processing, the process flow described herein may also be applied to 193 nm (ArF) photolithography schemes.

Referring to FIG. 1, an unpatterned MTJ stack of layers 1 that will eventually become a plurality of MTJ cells in a MRAM or STT-MRAM device array is shown from a cross-sectional view. The MTJ stack is formed on a substrate 10 that in one embodiment comprises a bottom electrode in a memory device. The bottom electrode (BE) may be a multilayer structure and is typically embedded in a dielectric layer (not shown) to electrically insulate the BE from adjacent bottom electrodes. The substrate may also include a substructure comprised of a plurality of transistors wherein each transistor is electrically connected to an overlying BE.

MTJ stack 1 is deposited on substrate 10 and in the exemplary embodiment has a bottom spin valve configuration wherein seed layer 11, pinned or reference layer 12, tunnel barrier 13, free layer 14, and hard mask 15 are sequentially formed on the substrate. Each of the reference layer and free layer preferably have PMA with a magnetization aligned in a positive or negative z-axis direction. In other embodiments, at least one additional layer may be included in the aforementioned MTJ stack such as a metal oxide layer between the free layer and hard mask that enhances PMA in the free layer. The seed layer may be comprised of one or more of NiCr, Ta, Ru, Ti, TaN, Cu, Mg, or other elements or alloys typically employed to promote a smooth and uniform grain structure in overlying layers.

Reference layer 12 may have a synthetic anti-parallel (SyAP) configuration represented by AP2/Ru/AP1 where an anti-ferromagnetic coupling layer made of Ru (or Rh, or Ir), for example, is sandwiched between an AP2 magnetic layer and an AP1 magnetic layer (not shown). The AP2 layer, which is also referred to as the outer pinned layer is formed on the seed layer while AP1 is the inner pinned layer and typically contacts the tunnel barrier. AP1 and AP2 layers may be comprised of CoFe, CoFeB, Co, or a combination thereof. In other embodiments, the reference layer may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB or Co may be inserted between the uppermost layer in the laminated stack and the tunnel barrier layer.

Tunnel barrier layer 13 is preferably a metal oxide layer comprised of one or more of MgO, TiOx, AlTiO, MgZnO, $Al_2O_3$, ZnO, ZrOx, HfOx, and MgTaO. More preferably, MgO is selected as the tunnel barrier layer because it provides the highest magnetoresistive ratio, especially when sandwiched between a free layer and reference layer that are CoFeB layers, for example.

Free layer 14 may be Co, Fe, CoFe, or an alloy thereof with one or both of B and Ni, or a multilayer stack comprising a combination of the aforementioned compositions. In another embodiment, the free layer may have a non-magnetic moment diluting layer such as Ta or Mg inserted between two CoFe or CoFeB layers that are ferromagnetically coupled. In an alternative embodiment, the free layer has a SyAP configuration such as FL1/Ru/FL2 where FL1 and FL2 are two magnetic layers that are antiferromagnetically coupled, or is a laminated stack with inherent PMA described previously with respect to the reference layer composition.

The hard mask 15 is also referred to as a capping layer and is typically comprised of one or more of Ta, Ru, TaN, Ti, TiN, and W. It should be understood that other hard mask materials including MnPt may be selected in order to provide high etch selectivity relative to underlying MTJ layers during an etch process that forms MTJ cells with sidewalls that stop on the bottom electrode. All layers in the MTJ stack may be deposited in a DC sputtering chamber of a sputtering system such as an Anelva C-7100 sputter deposition system that includes ultra high vacuum DC magnetron sputter chambers with multiple targets and at least one oxidation chamber. Usually, the sputter deposition process involves an argon sputter gas and a base pressure between $5\times10^{-8}$ and $5\times10^{-9}$ torr.

Once all of the layers 11-15 are formed, MTJ stack 1 may be annealed by heating to a temperature between about 360° C. to 400° C. for a period of up to a plurality of hours to grow a bcc structure in the reference layer, free layer, and tunnel barrier layer thereby enhancing PMA in the reference layer and free layer. The matching crystal structure in the aforementioned layers is also believed to improve the magnetoresistive ratio in the subsequently formed MTJ cells.

Figure 2:
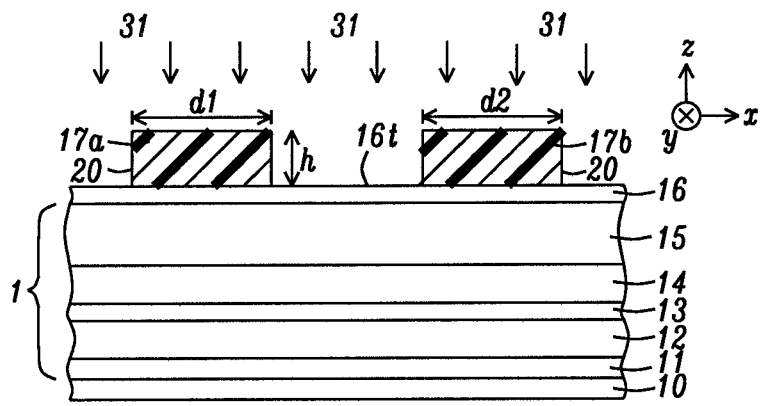
FIG. 2 is a cross-sectional view of a halogen treatment process that is applied to the island features resulting from the photolithography process in FIG. 1 according to an embodiment of the present disclosure.

A first step in the MTJ patterning process according to the present disclosure is depicted in FIG. 1 where a BARC or DARC layer 16 (hereinafter referred to as BARC/DARC), and a photoresist layer 17 are sequentially coated on the hard mask 15. The DARC layer may be silicon oxynitride, silicon oxycarbide, or hydrogenated silicon oxycarbide. BARC/DARC has a refractive index that minimizes reflection of light during the subsequent patternwise exposure thereby enabling more uniform island shapes with minimal CD non-uniformity to be formed in the photoresist layer. Next, a conventional photolithography process comprising patternwise exposure, a post-exposure bake, and then development in aqueous base is followed to form a pattern in the photoresist layer that comprises a plurality of islands with sidewall 20 (FIG. 2). During patternwise exposure, incident light 30 contacts photoresist top surface 17t only in selected regions that are determined by transparent openings in an overlying quartz mask (not shown). In a preferred embodiment, a KrF (248 nm) exposure system is employed to perform the patternwise exposure, post-exposure bake, and development step, which avoids a more costly ArF (193 nm) alternative. However, island features may also be formed by 193 nm patternwise exposures in certain applications when 248 nm exposures are unable to provide a target CD that is small enough for advanced MRAM or STT-MRAM designs.

Those skilled in the art will appreciate photoresist layer 17 may be either a positive tone or negative tone material where exposed regions are soluble in aqueous base developer (positive tone), or are insoluble in developer (negative tone). The appropriate photoresist is selected based on pattern design including d1 and d2 sizes, feature shape such as islands or line/space arrays, and photoresist thickness retention among other criteria. Process latitude including depth of focus, exposure latitude, and sensitivity of CD non-uniformity to post-bake temperature variations are also details to be considered when selecting a photoresist layer that is commercially available from multiple suppliers.

In the exemplary embodiment shown in FIG. 2, the photolithography process produces a plurality of island features also referred to as device features including island 17a having a width d1 and adjacent island 17b having a width d2 that are also referred to as critical dimensions (CDs) where d1>d2. In some embodiments, all device features are intended to have the same width (target width) but due to imperfections in the photolithography process, variations such as d1>d2 occur. The non-uniformity in d1, d2 widths across the wafer may be expressed as a sigma value as explained later. In other embodiments, island 17a and other island features (not shown) in the same row or column of an array may have a width substantially equal to d1 that is intentionally larger than d2 for island 17b due to mask design. Moreover, there may be other island features in a row or column with island 17b each having a width substantially equal to d2 that is intentionally less than width d1 in an adjacent row of island 17a features. In this case, a first CD non-uniformity is associated with the row of island 17a features and a second CD non-uniformity associated with the row of island 17b features. Preferably, non-uniformity for each CD in the photoresist pattern is minimized to ensure greater performance uniformity in the resulting devices formed after the photoresist pattern is etch transferred through underlying layers.

All features in the photoresist pattern have a thickness h, and a sidewall 20 that is substantially orthogonal to BARC/DARC top surface 16t. According to one embodiment, all device features have a target width proximate to d1 and d2. However, the present disclosure also encompasses an embodiment where the photoresist pattern not only comprises d1 and d2 feature widths, but also has a plurality of different feature widths that are greater than d1 because of the mask design used in the photolithography process. Preferably, all device features are processed to form active MTJ cells in the underlying MTJ stack.

Figure 9:
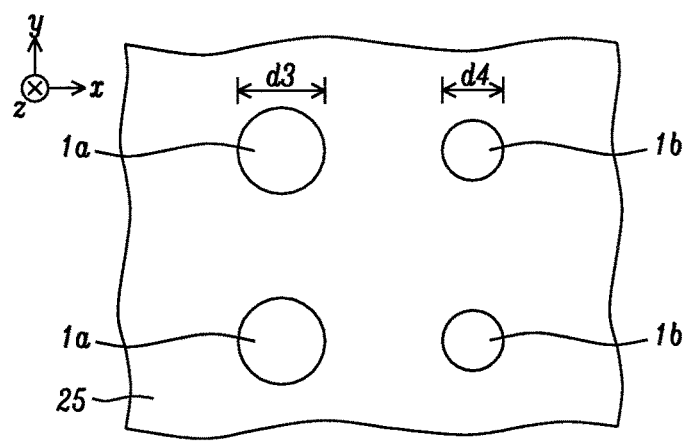
FIG. 9 is a top-down view of the MTJ pattern in FIG. 7 according to an embodiment of the present disclosure.

As shown by the top-down view in FIG. 9 at an intermediate step in the memory device fabrication process, photoresist device features with a CD substantially equal to d2 will be processed to fabricate MTJ cells 1b having a CD substantially equal to d4 where d4<d2 while adjacent photoresist features with a CD substantially equal to d1 will yield MTJ cells 1a having a CD substantially equal to d3 where d3<d1. Thus, the islands in the photoresist pattern will be processed to transform MTJ stack 1 into a plurality of MTJ cells in an array with multiple rows and columns. Only two partial rows and two partial columns are shown to simplify the drawing. Generally, millions of MTJs are formed on a work piece (wafer) before the wafer (not shown) is diced to provide individual MRAM or STT-MRAM devices, for example.

Returning to FIG. 2, all islands 17a, 17b may be circular such that d1 and d2, respectively, are formed in both of the x-axis and y-axis directions. In other embodiments, the top-down shape (not shown) of islands in FIG. 2 may be an ellipse or a polygon such that the y-axis dimension is different from the x-axis dimension. In either case, at least one of the x-axis or y-axis dimensions is a CD, which is the smallest feature width in the photoresist pattern.

A key feature of the present disclosure is that the photoresist pattern is subjected to a halogen treatment 31 in a process chamber wherein a plasma is generated during a period of about 5 to 100 seconds by using conditions comprising a RF source power of 100 to 1000 Watts, a bias power from 0 to 100 Watts, and a halogen gas flow from 10 to 200 sccm wherein the halogen gas is one of HBr, HCl, HI, $Cl_2$, $Br_2$, or $F_2$, and provides a base pressure of 8 to 50 mTorr in the process chamber.

Figure 3:
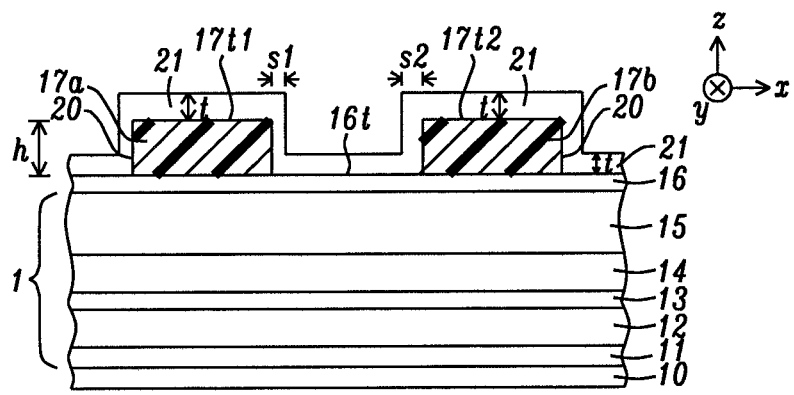
FIG. 3 is cross-sectional view of the photoresist pattern in FIG. 2 after a non-uniform passivation layer is formed on the island features according to an embodiment described herein.

Referring to FIG. 3, the halogen treatment forms a halogen passivation layer 21 (hereinafter referred to as passivation layer) on sidewalls 20, on BARC/DARC top surface 16t, and on top surfaces 17t1 and 17t2 of island features 17a, 17b, respectively. We have surprisingly found the halogen treatment may be controlled to provide a passivation layer thickness t on the top surfaces of the island features and BARC/DARC that is greater than thicknesses s1, s2 on the sidewalls of device features 17a, 17b, respectively. Moreover, s2 is larger than s1. Generally, thickness t is from about 1 nm to 10 nm. Treatment times less than 5 seconds may lead to incomplete passivation layer coverage on sidewalls 20, especially when forming thickness s1. On the other hand, reaction times greater than 100 seconds may cause s2 to be undesirably large such that a subsequent etch step to remove the passivation layer is lengthened and slows throughput significantly.

It should be understood that due to imperfections in the quartz mask employed for the patternwise exposure, and inherent variability in the photolithography process steps, there is non-uniformity across the wafer in each of the island features 17b having a CD substantially equal to d2. Thus, some island features 17b typically have a CD above the average d2 value while others have a CD below the average d2 value. Actual non-uniformity (sigma) for measured d2 widths may be around 2.3%. According to the present disclosure, another important outcome of the halogen treatment is formation of a thinner passivation layer on the sidewalls of island features 17b having an actual d2 value greater than the target d2 CD than on sidewalls of island features with a d2 value less than the target CD. Likewise, the passivation layer is thinner on sidewalls of island features with CD d1 than on sidewalls of features of CD d2 when d1>d2. The non-uniformity of passivation layer thickness will be an advantage in reducing device feature CD non-uniformity as explained with regard to the following step.

Figure 4:
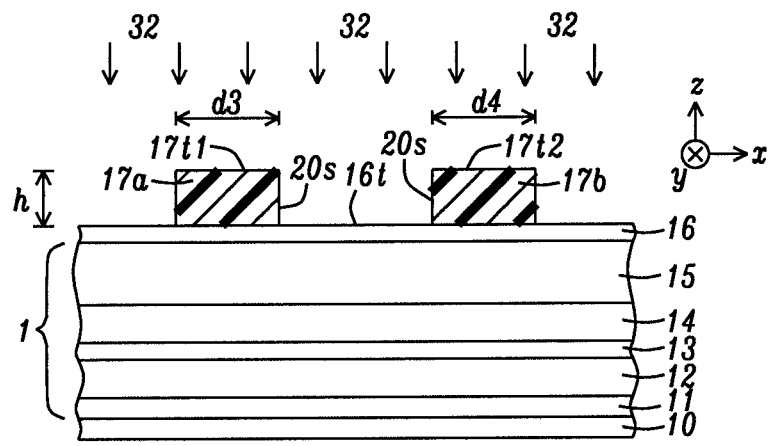
FIG. 4 is a cross-sectional view photoresist pattern in FIG. 3 after an $O_2$, $O_2$+halogen, or $O_2$+fluorocarbon based RIE is used to remove the passivation layer and shrink the CD of the island features.

Referring to FIG. 4, a reactive ion etch (RIE) 32 is performed and comprises a plasma generated from $O_2$, or from one or both of $O_2$ mixed with a halogen such as $Cl_2$, or $O_2$ mixed with a fluorocarbon including but not limited to $CF_4$, $CHCF_3$, and $C_4F_8$. The RIE step may be performed in the same chamber as the halogen treatment to improve throughput, or may be carried out in a different process chamber within a process tool that has multiple process chambers. In particular, the passivation layer is removed but the process of etching the passivation layer slows the etching of device features 17a, 17b as portions thereof become exposed to the etchant species derived from pure $O_2$, or from a mixture of $O_2$ with a fluorocarbon or halogen. Note that RIE 32 is preferably performed after first heating the wafer on which the MTJ stack is formed to a temperature in the range of 50° C. to 100° C., and preferably around 80° C. The heating is continued while the plasma is generated for the RIE step. Therefore, a certain amount of pattern shrinkage that is measured after the RIE is completed is believed to be associated with a reflow of the photoresist features caused by the heating. A reflow of island features may occur before plasma is generated in the RIE chamber, and during the RIE step.

Since sidewalls 20 have a thinner covering of the passivation layer than top surfaces of the photoresist features, the sidewalls are exposed to plasma during RIE step 32 before the RIE end point is reached. Accordingly, photoresist material is removed from outer portions of island features 17a, 17b proximate to the sidewalls after passivation layer thickness s1 (or s2) is etched away, and until the RIE end point thereby forming new sidewalls 20s, shrinking feature width d1 to d3, and shrinking feature width d2 to d4. Note that the difference (d1–d3) is greater than the difference (d2–d4). Furthermore, device features having a d1 (or d2) greater than the target CD are shrunk to a greater extent than device features with a d1 (or d2) value less than the target CD. As a result, CD non-uniformity (sigma) may be reduced from greater than 2% to about 1% when accounting for a plurality of features 17a, 17b across the wafer.

Another advantage of the process flow comprising the halogen treatment and then RIE removal of the passivation layer is that photoresist thickness h is maintained. In other words, the effectiveness of photoresist features 17a, 17b to serve as a mask layer for a subsequent RIE through hard mask 15 is retained. This result means a thinner photoresist layer may be used for the photolithography step with incident light 30, which in turn enables smaller d1 and d2 feature widths to be formed than otherwise would be possible for a KrF exposure system, or alternatively with an ArF exposure system.

Figure 5:
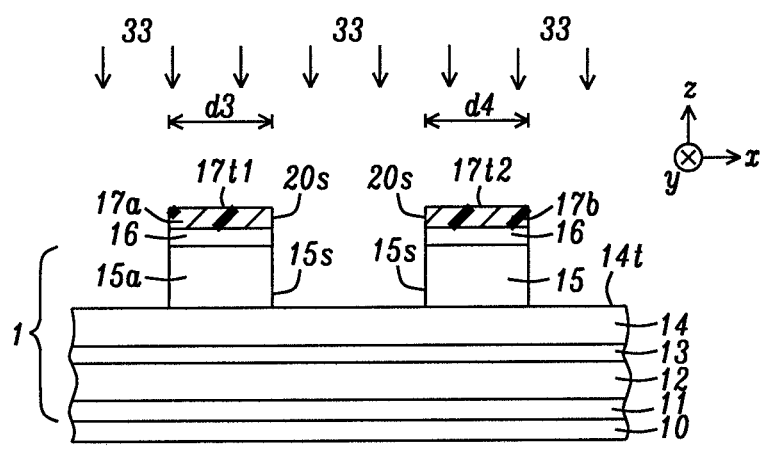
FIG. 5 is a cross-sectional view showing a second RIE step that is used to transfer the photoresist pattern into an underlying hard mask according to an embodiment of the present disclosure.

Referring to FIG. 5, a second RIE may comprise fluorocarbon plasma 33 to transfer the photoresist pattern including island features 17a, 17b through the BARC/DARC layer 16, through hard mask 15, and stopping on free layer top surface 14t. However, the present disclosure anticipates that other gases or gas mixtures known in the art may be used for the second RIE step. In some embodiments, the second RIE comprises plasma generated from $O_2$, $O_2$ with a halogen, $O_2$ with a fluorocarbon, or a combination thereof, and is performed in the same process chamber as the first RIE. Accordingly, sidewall 15s is formed on the hard mask and is coplanar with sidewall 20s such that width d3 is essentially duplicated in the DARC/BARC and hard mask layers below device feature 17a, and width d4 is formed in the hard mask layer below device feature 17b. As indicated earlier, there is a first plurality of island features 17a each having a width substantially equal to d3, and a second plurality of island features 17b each having a width substantially equal to d4 in the photoresist pattern. Thus, hard mask feature 15a having a width substantially equal to d3 is formed below each island feature 17a, and a hard mask feature 15b having a width substantially equal to d4 is formed below each island feature 17b.

Typically, the photoresist layer is thinned during the second RIE, and in some cases may be completely removed. However, the BARC/DARC layer serves as an etch mask if the photoresist features are completely eroded before the second etch progresses through the hard mask and stops on top surface 14t. The present disclosure also anticipates the second RIE may be a continuation of the first RIE step 32 in a process flow where a plasma generated from $O_2$, or $O_2$ mixed with a fluorocarbon or halogen is used in both steps and in the same process chamber.

In the embodiments described herein, it should be understood that IBE may replace RIE for hard mask etching. IBE typically comprises noble gas ions and rotating the work piece (wafer) on which the MTJ stack of layers is formed. Moreover, the incident or penetration angle of noble gas ions directed at the work piece may be between 0° and 90°. On the other hand, the work piece is stationary during RIE, and the resulting plasma is limited to a vertical direction that is orthogonal to the work piece surface. According to the present disclosure, an IBE through the hard mask may comprise oxygen and a noble gas, or one of the aforementioned chemistries mentioned with respect to a RIE process.

Figure 6:
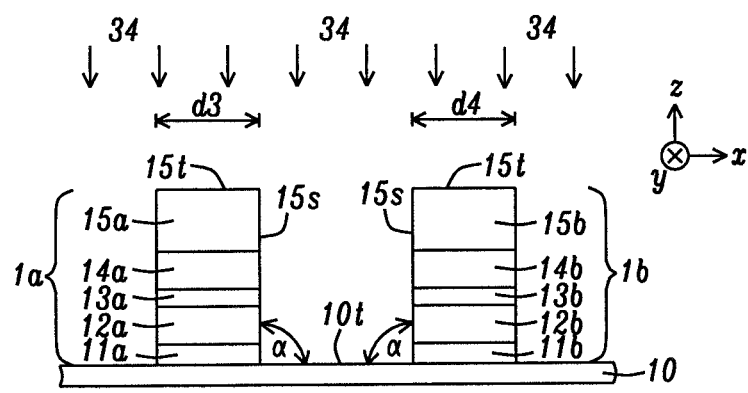
FIG. 6 is a cross-sectional view of the MTJ in FIG. 5 after a RIE or IBE process is employed to transfer the pattern in the hard mask through the remaining MTJ layers according to an embodiment of the present disclosure.

In FIG. 6, a RIE or IBE step 34 is used to transfer the hard mask pattern comprised of features 15a and features 15b through the underlying MTJ layers 11-14. The end result is extension of sidewall 15s to substrate top surface 10t, formation of a plurality of MTJ cells 1a with layers 11a-15a each having a CD substantially equal to d3, and formation of a plurality of MTJ cells 1b with layers 11b-15b each having a CD that is substantially equal to width d4. Note that RIE may cause chemical damage to sidewall 15s of MTJ layers while IBE is associated with a build up of material that has been etched and then redeposited on MTJ sidewalls. In related patent application Ser. No. 15/595,484, we described a RIE or IBE process based on plasma or ions, respectively, that are generated from a combination of noble gas (Ar) and an oxidant such as MeOH to yield substantially clean MTJ sidewalls with minimal sidewall damage.

In one preferred embodiment, etch step 34 comprises a physical component represented by noble gas ions and plasma based on one of Ar, Kr, Ne, and Xe, and a chemical component comprised of plasma and ions derived from one or more of methanol, ethanol, $H_2O_2$, $H_2O$, $N_2O$, $NH_3$, and CO. A stable plasma may be formed with a RF power between 600 Watts and 3000 Watts at a temperature proximate to room temperature. In some RIE embodiments, the RF power applied to an upper electrode may be different than the RF power applied to a lower electrode in the RIE chamber. Although sidewall 15s is substantially vertical in the exemplary embodiment, angle α may be reduced to about 80° or 85° depending on the noble gas/oxidant ratio. In other words, seed layer 11a may have a width less than d3, and seed layer 11b may have a width<d4 when sidewalls 15s are not orthogonal to substrate top surface 10t. In embodiments wherein the noble gas is Ar and the oxidant is methanol, a ratio of the Ar flow rate to the methanol or oxidant flow rate is preferably in the range of 50:50 to 98:2. In an alternative embodiment, etch step 34 is an IBE ion beam etch comprising ions of a noble gas that is one of Ar, Kr, Ne, and Xe.

Generally, the DARC/BARC layer is removed during etch step 34. It is important that hard mask features 15a, 15b have sufficiently higher etch resistance to the plasma and/or ions in etch step 34 than underlying layers 11a-14a and 11b-14b, respectively, such that a substantial amount of hard mask thickness remains after the etch thereby ensuring that width d3 is formed in MTJ device 1a, and width d4 is formed in MTJ device 1b.

Figure 7:
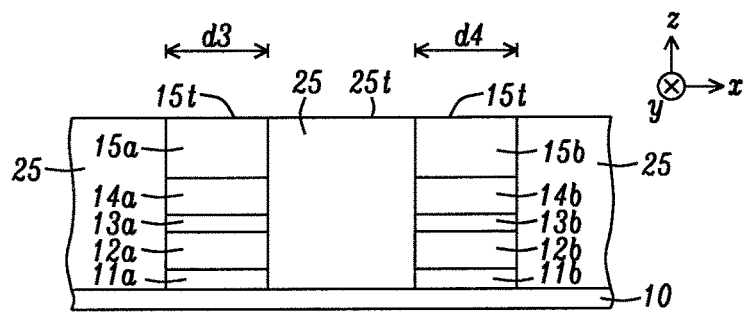
FIG. 7 is a cross-sectional view of the MTJ in FIG. 6 following deposition of an encapsulation layer and planarization to electrically insulate MTJs from each other.

Referring to FIG. 7, an encapsulation layer 25 that is comprised of one or more dielectric materials and may have a plurality of sub-layers (not shown) is deposited over the MTJ array including MTJ cell 1a and MTJ cell 1b. Preferably, the encapsulation layer has a thickness of 5-250 nm and is one or more of SiN, $SiO_2$, SiON, MgO, $Al_2O_3$, AlN, BN, BO, or the like that serves to electrically insulate adjacent MTJ cells from one another. According to one embodiment, the encapsulation layer is deposited by physical vapor deposition (PVD), chemical vapor deposition (CVD), ion beam deposition (IBD), or atomic layer deposition (ALD) without breaking the vacuum in the process chamber previously employed for performing etch step 34. In other embodiments, the encapsulation layer is deposited in a separate chamber than the process chamber employed for etch step 34.

Thereafter, a chemical mechanical polish (CMP) process or another planarization method known in the art may be performed to form a top surface 25t on the encapsulation layer that is coplanar with top surface 15t on hard mask layers 15a, 15b. In some embodiments, the CMP process removes any DARC or BARC layer 16 remaining after etch step 34 in the previously described process sequence.

Referring to FIG. 9, the plurality of MTJ cells 1a, and plurality of MTJ cells 1b formed by an etch process or process flow of the present disclosure is depicted from a top-down view after a planarization step such as a CMP is performed. MTJ cells 1a are shown in a first row while MTJ cells 1b are in an adjacent row. As explained previously, MTJ cells are depicted with a circular shape but may have elliptical or polygonal shapes in other embodiments. Generally, millions of MTJ cells are formed in an array of multiple rows and columns but only four cells are illustrated here to simplify the drawing.

Thereafter, a top electrode layer comprised of a plurality of parallel conductive lines (not shown) is formed by a conventional method on MTJ cells 1a, 1b and on encapsulation layer 25 as appreciated by those skilled in the art. Conductive lines (i.e. source lines) in the top electrode layer are preferably formed along the y-axis direction that is orthogonal to the conductive lines such as bit lines (not shown) below a bottom electrode layer and along the x-axis direction in the substrate.

We have demonstrated the benefits of the photolithography and etch process flow of the present disclosure with results from an experiment where a plurality of MTJ cells was fabricated with a process flow comprising halogen treatment of a photoresist pattern, and subsequent etch removal of the passivation layer formed by the halogen treatment. A MTJ stack of layers was formed on a wafer and included a TaN/NiCr seed layer, a MgO tunnel barrier layer between a CoFeB free layer and a CoFeB reference layer, and an uppermost Ta hard mask. Next a SiON (DARC) layer with a thickness of 300 nm was deposited on the hard mask by a CVD method. In the following step, a KrF photoresist PEK500 supplied by Sumika Inc. was spin coated on the DARC and pre-baked to give a 200 nm thick photoresist layer. The photolithography process was performed using a proprietary quartz mask, and the recommended process conditions from the photoresist supplier. Wafers were exposed on a Nikon KrF exposure tool with numerical aperture NA=0.6-0.8 that is connected to a track system to enable the wafers to be shuttled to and from post-expose bake and developer stations after the patternwise expose step. The resulting photoresist pattern comprised rows each having a plurality of island shapes with a target width d2=72 nm after the photolithography process was completed. The pattern also contained rows of island shapes having a target width d1=100 nm where d1 shapes alternate with rows of d2 island shapes.

Figure 8:
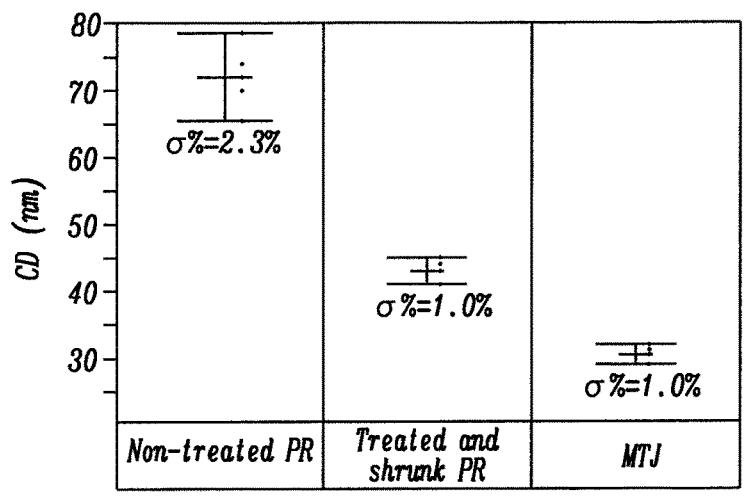
FIG. 8 is a plot showing a reduction in CD and CD non-uniformity (sigma) for a photoresist pattern after halogen treatment and passivation layer removal (FIG. 4) according to an embodiment of the present disclosure compared with the CD and CD non-uniformity before shrinking the feature size.

The left side of the plot in FIG. 8 shows the pattern non-uniformity measured on the wafers after the photoresist patterning step. Note that actual d2 values for island features range from 67 to 79 nm across the wafer for a sigma=2.3%.

Thereafter, the photoresist pattern was subjected to a halogen treatment described previously by holding the wafer on a chuck in a RIE process chamber while a passivation layer was formed thereon. In particular, the photoresist pattern was treated for 10 seconds with a plasma generated with the following conditions: a 100 sccm flow rate of $Cl_2$; RF power of 100 Watts; no bias power, and a base pressure of 8 mTorr.

In the following step, the passivation layer was removed from the photoresist pattern by a RIE step wherein a plasma was formed in the same process chamber with the following conditions: a 100 sccm flow of $O_2$, 100 sccm flow of $Cl_2$; a RF power of 100 Watts; and a chamber pressure of 8 mTorr for a period of 15 seconds. Returning to FIG. 8, the photoresist pattern on the wafer was remeasured after the RIE shrink step and the results are shown on the middle of the plot. The CD (d2 width in FIG. 2) with an average value of about 72 nm has been reduced to about 44 nm (d4 in FIG. 4) as a result of the $O_2$/$Cl_2$ RIE step. All measurements were obtained from cross-sectional views using a scanning electron microscope (SEM). Not only has the CD been significantly reduced, photoresist thickness is maintained at 200 nm and CD non-uniformity is lowered to a sigma of 1%. As a reference, the d1 island shapes were shrunk to a greater extent from 100 nm (d1 width in FIG. 2) to about 60 nm (d3 in FIG. 4).

The wafer was then etched with $CF_4$ plasma to transfer the photoresist pattern through the DARC layer and hard mask. Next, MTJ cells were fabricated with a RIE step comprising an Ar/MeOH etch described in related patent application Ser. No. 15/595,484. Thereafter, MTJ sidewalls were sputter etched with Ar plasma generated with a RF power of 800 Watts and a 20 sccm flow rate of Ar in order to remove any residue from the Ar/MeOH etch. As indicated on the right side of FIG. 8, the CD non-uniformity of 1% sigma is substantially maintained in the resulting MTJ device cells after the etch transfer process through the MTJ stack of layers is completed. In some embodiments, the sputter etch of MTJ sidewalls may further shrink the average CD below the value obtained after the passivation layer removal in the exemplary embodiment.

As mentioned previously, the present disclosure also applies to shrinking features in photoresist patterns comprised of line/space patterns or other designs that are not island features. The alternative patterns may be formed on film stacks that are subsequently processed to yield semiconductor devices that are not necessarily memory devices (i.e. logic devices) as appreciated by those skilled in the art.

While this disclosure has been particularly shown and described with reference to, the preferred embodiment thereof, it will be understood by those skilled in the art that various changes in form and details may be made without departing from the spirit and scope of this disclosure.

We claim:

1. A method of reducing a feature width in a photoresist pattern, comprising:
   (a) forming a bottom anti-reflective coating (BARC) or a dielectric anti-reflective coating (DARC) on a substrate;
   (b) coating a photoresist layer having a thickness (h) on the BARC or DARC and patterning the photoresist layer to form a plurality of first features each having a critical dimension (CD) substantially equal to a first width (d1), and a plurality of second features each having a CD substantially equal to a second width (d2) where d1>d2, and wherein there is a first CD non-uniformity (v1) in the plurality of first and second features across the substrate;
   (c) performing a halogen treatment in a process chamber wherein the patterned photoresist layer is subjected to a plasma that is generated from one of HBr, HCl, HI, $Cl_2$, $Br_2$, and $F_2$ thereby forming a halogen passivation layer that has a first thickness (t) on a top surface of the plurality of first and second features, a second thickness (s1) on a sidewall of each of the plurality of first features, and a third thickness (s2) on a sidewall of the each of the plurality of second features where t is greater than s1 and s2, and s1<s2; and
   (d) performing an etch step comprised of a plasma generated from $O_2$, $O_2$ with a halogen, $O_2$ with a fluorocarbon, or a combination thereof that removes the halogen passivation layer and etches away outer portions of the each of the first and second plurality of features proximate to the sidewalls thereof such that thickness (h) is maintained, the CD for the first plurality of features is reduced to a third width (d3), and the CD for the second plurality of features is reduced to a fourth width (d4) where a difference (d1−d3) is greater than a difference (d2−d4), and there is a second CD non-uniformity (v2) in the plurality of first and second features across the wafer where v2<v1.

2. The method of claim 1 wherein the DARC is silicon oxynitride, silicon oxycarbide, or hydrogenated silicon oxycarbide.

3. The method of claim 1 wherein the photoresist layer is a negative tone or a positive tone material and the patterning comprises patternwise exposure to 248 nm or 193 nm light.

4. The method of claim 1 wherein the fourth width (d4) is less than 60 nm.

5. The method of claim 1 wherein the plasma in the halogen treatment is generated in a process chamber using conditions comprising a radio frequency (RF) source power of 100 to 1000 Watts, a bias power from 0 to 100 Watts, a halogen gas flow from 10 to 200 standard cubic centimeters per minute (sccm), and a base pressure of 8 to 50 mTorr for about 5 to 100 seconds.

6. The method of claim 1 wherein the etch step is performed in the process chamber used for the halogen treatment.

7. The method of claim 1 wherein the features are islands or line/space shapes.

8. The method of claim 1 wherein step (d) further comprises heating the substrate to a temperature of about 50° C. to 100° C. before the plasma is generated, and while the etch step is performed.

9. A method of forming a plurality of MTJ cells on a substrate, comprising:
   (a) forming a photoresist pattern on a MTJ stack of layers having an uppermost hard mask layer wherein the photoresist pattern comprises a first plurality of features each having a CD substantially equal to a first width (d1) and a second plurality of features each having a CD substantially equal to a second width (d2) where d1>d2, and there is a first CD non-uniformity (v1) in the first and second plurality of features across the substrate;
   (b) treating the photoresist pattern with a halogen plasma that is generated from one of HBr, HI, $Cl_2$, $Br_2$, and $F_2$ thereby forming a halogen passivation layer that has a first thickness (t) on a top surface of the first and second plurality of features, a second thickness (s1) on a sidewall of each of the first plurality of features, and a third thickness (s2) on a sidewall of each of the second plurality of features where t is greater than s1 and s2, and s1<s2;
   (c) performing a first etch step comprised of a plasma generated from $O_2$, $O_2$ with a halogen, $O_2$ with a fluorocarbon, or a combination thereof in a first process chamber that removes the halogen passivation layer and etches away outer portions of the first and second plurality of features such that a thickness of the photoresist pattern is maintained, the CD for the second plurality of features is reduced to a fourth width (d4), and the CD for the first plurality of features is reduced to a third width (d3) where a difference (d1−d3) is greater than a difference (d2−d4), and there is a second CD non-uniformity (v2) for the plurality of first and second features across the wafer where v2<v1;
   (d) performing a second etch step to transfer the photoresist pattern comprised of the first and second plurality of features through the hard mask layer thereby forming a hard mask pattern comprised of a first hard mask feature having the third width d3 below each of the plurality of first features, and a second hard mask feature having the fourth width d4 below each of the plurality of second features; and
   (e) performing a third etch step to transfer the hard mask pattern through an underlying MTJ stack of layers and stopping on the substrate thereby forming a plurality of first MTJ cells each having one of the first hard mask features and a width substantially equal to d3, and a plurality of second MTJ cells each having one of the second hard mask features and a width substantially equal to d4.

10. The method of claim 9 wherein the photoresist layer is a negative tone or positive tone material, and forming the photoresist pattern comprises patternwise exposure to 248 nm light or to 193 nm light.

11. The method of claim 9 wherein the fourth width (d4) is less than 60 nm.

12. The method of claim 9 wherein the halogen plasma is generated in a process chamber using conditions comprising a radio frequency (RF) source power of 100 to 1000 Watts, a bias power from 0 to 100 Watts, a halogen gas flow from 10 to 200 sccm, and a base pressure of 8 to 50 mTorr for about 5 to 100 seconds.

13. The method of claim 9 wherein the second etch step is a reactive ion etch comprising $O_2$, $O_2$ with a halogen, $O_2$ with a fluorocarbon, or a combination thereof, and is performed in the first process chamber.

14. The method of claim 13 wherein the fluorocarbon is one of $CF_4$, $CHF_3$, or $C_4F_8$.

15. The method of claim 9 wherein step (c) further comprises heating the substrate to a temperature of about 50° C. to 100° C. before the plasma is generated, and while the first etch step is performed.

16. The method of claim 9 wherein the second etch is an ion beam etch comprising ions of a noble gas that is one of Ar, Kr, Ne, and Xe.

17. The method of claim 9 wherein the third etch is a reactive ion etch that comprises a flow rate of a noble gas, and a flow rate of an oxidant.

18. The method of claim 17 wherein the noble gas is Ar, the oxidant is methanol, and a ratio of an Ar flow rate to a methanol flow rate is from about 50:50 to 98:2.

19. The method of claim 9 wherein the third etch is an ion beam etch comprising ions of a noble gas that is one of Ar, Kr, Ne, and Xe.

20. The method of claim 9 wherein the plurality of first MTJ cells and the plurality of second MTJ cells each have sidewalls that are formed substantially orthogonal to a top surface of the substrate.

21. The method of claim 9 wherein forming the photoresist pattern comprises forming a bottom anti-reflective (BARC) layer or dielectric anti-reflective coating (DARC) on the hard mask layer, coating a photoresist layer on the BARC or DARC layer, and then patternwise exposing and developing the photoresist layer.

* * * * *